(12) United States Patent
Zenz

(10) Patent No.: US 8,695,207 B2
(45) Date of Patent: Apr. 15, 2014

(54) METHOD FOR MANUFACTURING AN ELECTRONIC DEVICE

(75) Inventor: Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/995,797

(22) PCT Filed: May 13, 2009

(86) PCT No.: PCT/IB2009/051964
§ 371 (c)(1),
(2), (4) Date: Apr. 18, 2011

(87) PCT Pub. No.: WO2009/147546
PCT Pub. Date: Dec. 10, 2009

(65) Prior Publication Data
US 2011/0189824 A1    Aug. 4, 2011

(30) Foreign Application Priority Data

Jun. 2, 2008   (EP) .................................... 08104215

(51) Int. Cl.
*H01P 11/00* (2006.01)
(52) U.S. Cl.
USPC ........................................ 29/600; 340/572.7
(58) Field of Classification Search
USPC ................................. 340/572.7, 572.8; 29/600
See application file for complete search history.

(56) References Cited

U.S. PATENT DOCUMENTS

| | | | |
|---|---|---|---|
| 5,545,291 A * | 8/1996 | Smith et al. | 438/107 |
| 5,800,763 A | 9/1998 | Hoppe et al. | |
| 5,810,959 A | 9/1998 | Tanaka et al. | |
| 5,913,110 A * | 6/1999 | Herbst | 438/126 |
| 6,077,382 A | 6/2000 | Watanabe | |
| 6,080,668 A * | 6/2000 | Lauffer et al. | 438/666 |
| 6,113,728 A | 9/2000 | Tsukagoshi et al. | |
| 6,202,931 B1 | 3/2001 | Billebaud | |
| 7,253,735 B2 * | 8/2007 | Gengel et al. | 340/572.7 |
| 7,504,297 B2 * | 3/2009 | Watanabe et al. | 438/237 |
| 2004/0145874 A1 | 7/2004 | Pinel et al. | |
| 2005/0093172 A1 | 5/2005 | Tsukahara et al. | |
| 2007/0158804 A1 | 7/2007 | Hosoya et al. | |

(Continued)

FOREIGN PATENT DOCUMENTS

| | | |
|---|---|---|
| CA | 2128947 A1 | 1/1996 |
| DE | 19518936 A1 | 12/1995 |

(Continued)

OTHER PUBLICATIONS

"Substrate" OED.com. 2012. http://oed.com/view/Entry/193100?rskey=WKs4NJ&result=1&isAdvanced=false#eid (Aug. 15, 2012).*

(Continued)

*Primary Examiner* — Reema Patel

(57) ABSTRACT

In a method for manufacturing an electronic device an integrated circuit (1) is arranged between two layers (2, 3) of a substrate, said integrated circuit (1) having at least one contacting surface, a hole (4) is formed in at least one substrate layer (3) above said at least one contacting surface, a conductive structure (5) is formed on a surface of said at least one substrate layer (3) facing away from the integrated circuit (1) and said conductive structure (5) is connected to said contacting surface by means of said hole (4).

15 Claims, 1 Drawing Sheet

(56) References Cited

U.S. PATENT DOCUMENTS

| | | | |
|---|---|---|---|
| 2007/0200227 A1* | 8/2007 | Licht et al. | 257/718 |
| 2008/0217413 A1* | 9/2008 | Tanner | 235/492 |
| 2008/0297350 A1* | 12/2008 | Iwasa et al. | 340/572.1 |
| 2009/0072413 A1 | 3/2009 | Mahler | |

FOREIGN PATENT DOCUMENTS

| | | | |
|---|---|---|---|
| EP | 1014302 A1 | 6/2000 | |
| JP | 2000113147 A | 4/2000 | |
| WO | 02/49093 A1 | 6/2002 | |
| WO | 2005/104229 A | 11/2005 | |
| WO | 2007/075352 A2 | 7/2007 | |
| WO | 2009/147547 A1 | 12/2009 | |

OTHER PUBLICATIONS

"Etch.", Merriam-Webster.com. 2013. https://www.merriam-webster.com (Apr. 5, 2013).*

* cited by examiner

METHOD FOR MANUFACTURING AN ELECTRONIC DEVICE

FIELD OF THE INVENTION

The invention relates to a method for manufacturing an electronic device.

BACKGROUND OF THE INVENTION

Electronic devices within the scope of the present invention and in particular smartcards for RFID applications usually consist of an IC, packaged in a module, which is then connected with an antenna and subsequently integrated into a cardbody. For standard cards, normally the module is attached to a substrate foil, in which the insulated wire antenna is embedded and attached by a welding process to the module. This substrate foil then is called an inlay, which, in a separate step, is laminated into the final RFID card.

An alternative way to produce an inlay uses a so-called direct chip attach process. In that case, the antenna consists of a structured layer of a conductive material, such as a thin metal foil, conductive ink, a galvanic plated layer etc., and the IC is connected directly to the antenna via, e.g., a flip chip process.

For example in WO 2007/075352 A2 there is disclosed a method for the assembly of electrical devices and in particular for the assembly of RFID interposes and/or devices. This known method includes heat embedding a chip having bond pads (e.g. bumps) in a substrate and coupling the chip to an antenna element on an upper surface of said substrate. In such a process, the step of providing the antenna structure on a surface of the substrate layer and the step of contacting the antenna structure with the chip are separate, thereby giving rise to procedural inconvenience.

In order to couple the chip with the antenna structure the assembly is compressed. During compression the bumps of the chip penetrate the substrate to establish contact with the antenna structure on the upper surface of the substrate. During compression, considerable stress is applied to the chip in the region of the bond pads or bumps so that delicate structures of the chip should not be arranged in the region neighbouring the bumps and the chip in general should have a thickness sufficient to offer the necessary strength.

In all the described approaches, the actual transponder inlay is not flat, so that additional layers have to be added to compensate for the thickness differences to give a prelam, which then again can be laminated or glued into the final card. Structures using modules currently result in a minimum thickness of around 300 μm. Structures using direct chip attach reveal the disadvantage that the IC is more or less unprotected during the lamination process, which limits the IC thickness to around 100 μm in order to give reasonable die strength values. Assuming a flip chip process, additional bumps are required, which also can be seen as critical for mechanical reliability of the final product, since the stress concentration underneath the bumps is high.

Hence, it is an object of the invention to provide a method for manufacturing electronic devices, in which the above-mentioned disadvantages of the methods according to the state of the art are overcome.

OBJECT AND SUMMARY OF THE INVENTION

The object of the invention is achieved by a method for manufacturing an electronic device as set forth in claim 1.

Additional advantages of the present invention are achieved by the features as set forth in the dependent claims.

According to the invention, the method for manufacturing an electronic device, comprises the steps of
arranging an integrated circuit between two layers of a substrate, said circuit having at least one contacting surface,
forming a hole in at least one substrate layer above said at least one contacting surface and
forming a conductive structure on a surface of said at least one substrate layer facing away from the integrated circuit and connecting said conductive structure to said contacting surface by means of said hole, said steps of forming a conductive structure and of connecting said conductive structure being advantageously performed in a single process step.

The method according to the present invention allows for a process of manufacturing an electronic device and in particular smart cards for RFID applications, in which the application of mechanical stress on the chip during the step of connecting the conductive structure to the contacting surface of the integrated circuit is minimized. Connecting is performed via the hole in the at least one substrate layer, which is formed in the substrate layer prior to the connecting step so that the connecting step itself is not affected by any material displacement and any mechanical stress related thereto.

Since the chip is not compressed while contacting it with the antenna, the risk of formation of cracks is minimized. Since the chip is not exposed to mechanical stress, it can be designed thinner than those known from the state of the art and essential and, as the case may be, delicate structures of the chip can also be arranged in the region of the contacting surfaces. This allows for a smaller overall design of the chip.

Forming the conductive structure, e.g. the antenna structure, on a surface of a substrate layer and connecting it to the chip in a single process step provides a highly effective and economic process.

According to a particularly preferred embodiment of the inventive method, said step of forming a conductive structure on a surface of said at least one substrate layer and of connecting said conductive structure to said contacting surface comprises printing said structure with a conductive ink and during said printing filling said hole with ink thereby connecting the conductive structure with the connecting surface. Such a process is particularly easy to perform with known devices already used for printing antenna structures on substrate layers. The conductive ink, when applied in the region of the hole formed above the contact surface, naturally flows into the hole, thereby establishing contact with the contacting surface. In this way, said steps of forming a conductive structure and of connecting said conductive structure with the connecting surfaces of the integrated circuit can easily be performed in a single process step.

According to another embodiment of the present invention, said step of forming a conductive structure on a surface of said at least one substrate layer comprises structuring and etching the substrate to form metallic conducting paths.

In this connection, in a particularly advantageous embodiment of the present invention, said step of connecting said conductive structure to said contacting surface comprises applying a conductive paste or a conductive adhesive into the hole, whereby a particularly simple mode of establishing contact between the conductive antenna structure and the contacting surface of the chip is achieved while at the same time safe and durable contacting can be safeguarded.

In a particularly advantageous embodiment of the present invention said connecting said conductive structure to said contacting surface is done by soldering or electro-galvanic deposition.

According to a preferred embodiment of the inventive method said step of forming a hole comprises laser drilling. Laser drilling is known as a highly precise and cost effective manner of processing materials as commonly used in the field of the invention.

According to a preferred embodiment of the present invention said step of forming a hole is performed before the step of arranging said integrated circuit between the two layers of said substrate. In this way, handling is facilitated and the risk of negatively affecting the integrated circuit during the application of laser radiation is minimized.

According to a preferred embodiment of the present invention said conductive structure forms an antenna, such as an antenna for RFID applications.

In a particularly advantageous embodiment of the present invention said substrate is made from thermoplastic material.

In a preferred embodiment of the present invention said substrate layers with the integrated circuit arranged there between are laminated to form an inlay for a smartcard.

These and other aspects of the invention are apparent from and will be elucidated with reference to the embodiments described hereinafter.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
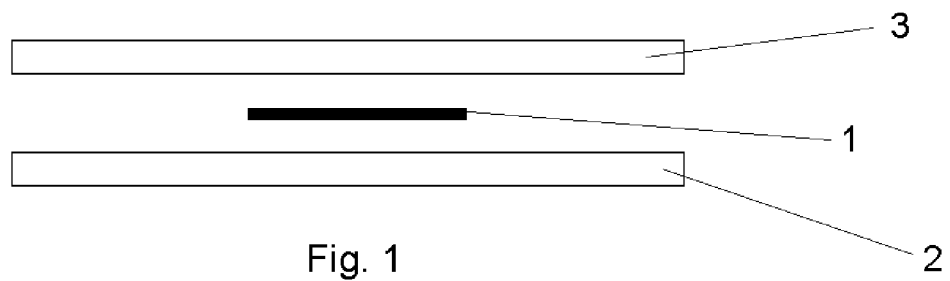
FIG. 1 shows the general arrangement of the substrate layers and the integrated circuit.
Figure 2:
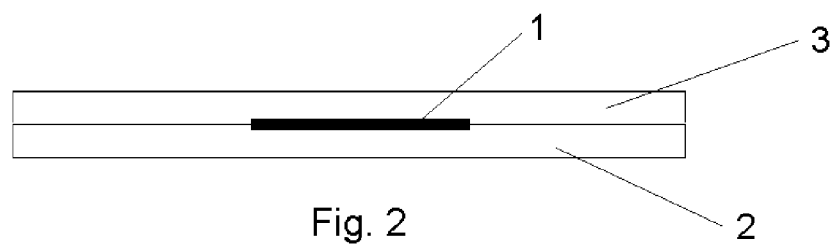
FIG. 2 shows the substrate layers and the integrated circuit after lamination.

In FIG. 1 an integrated circuit (IC) 1 is arranged between a first substrate layer 2 and a second substrate layer 3. The IC 1 can be attached either by using glue or directly to the substrate material by using thermal or ultrasonic processes. This arrangement is then laminated to give the structure as shown in FIG. 2. Due to the low IC 1 thickness the substrate layers 2,3 are nearly parallel and the IC 1 is hermetically sealed and well protected by the substrate layers 2,3.

Figure 3:
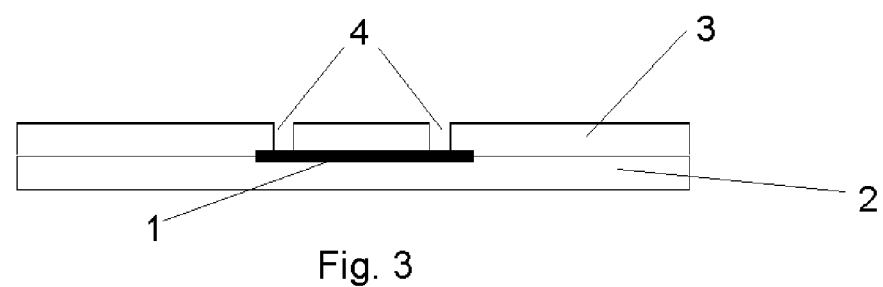
FIG. 3 shows the integrated circuit laminated between the layers of the substrate whereby the holes for connecting the integrated circuit with the conductive structure have already been drilled.
Figure 4:
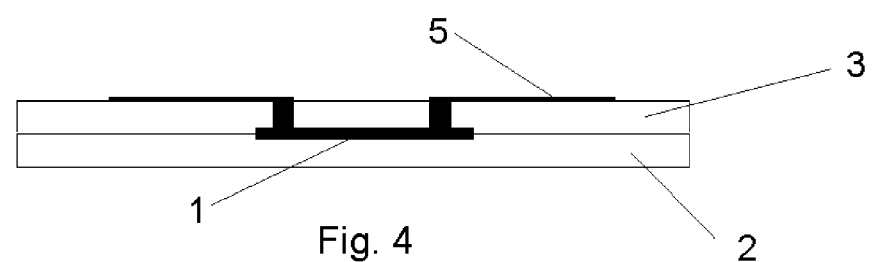
FIG. 4 shows the integrated circuit laminated into the substrate with the conductive structure on top of the substrate being contacted with the chip.

After this, holes 4 are made in the substrate layer 3 above the contacting surfaces of the IC 1 to give a structure as shown in FIG. 3. The contacting surfaces of the IC 1, such as, e.g., bond pads or bumps, are now in open connection to the ambience.

After this, the conductive structure 5 is printed on the surface of the second surface layer 3 with a conductive ink, so that the formation of the conductive structure, e.g. the antenna, and its coupling to the IC 1 via conductive material in the holes 4 are effected in one single process step.

In an alternative way of proceeding, the conductive structure 5 is formed by structuring and etching the substrate 3 and the connection to the IC 1 is achieved by applying a conductive paste or a conductive adhesive in the holes 4.

Regarding the sequence of the process steps, it has to be noted that forming the conductive structure 5 on the surface of the second surface layer 3 can also be done before drilling the holes or even before lamination.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprise" and its conjugations do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. Method for manufacturing an electronic device, comprising:

arranging and hermetically sealing a thin integrated circuit between two layers of a substrate so that the two layers are substantially parallel, said thin integrated circuit having at least one contacting surface;

forming a hole in at least one layer above said at least one contacting surface; and forming a conductive structure as an antenna on a surface of said at least one layer facing away from the thin integrated circuit and connecting said conductive structure to said contacting surface by said hole, wherein, said two layers of the substrate each being made from a thermoplastic material.

2. Method according to claim 1, wherein forming said conductive structure on said surface of said at least on substrate layer and of connecting said conductive structure to said connecting surface comprises printing said structure with a conductive ink and during said printing filling said hole with ink thereby connecting the conductive structure with the contacting surface.

3. Method according to claim 1, wherein forming said conductive structure on said surface of said at least one substrate layer comprises structuring and etching the substrate to form metallic conducting paths.

4. Method according to claim 1, wherein connecting said conductive structure to said contacting surface comprises applying a conductive paste or a conductive adhesive into the hole.

5. Method according to claim 1, wherein said connecting said conductive structure to said contacting surface is done by soldering or electro-galvanic deposition.

6. Method according to claim 1, wherein forming said hole comprises laser drilling.

7. Method according to claim 1, wherein forming said hole is performed before the step of arranging said integrated circuit between the two layers of said substrate.

8. Method according to claim 1, wherein said conductive structure forms an antenna for RFID applications.

9. Method according to claim 1, wherein the integrated circuit is of lower thickness than each of the two substrate layers.

10. Method according to claim 1, further comprising forming an inlay for a smartcard, wherein said substrate layers with the integrated circuit arranged there between are laminated, laminating the inlay into a cardbody of the smartcard.

11. Method according to claim 1, wherein the step of arranging includes sandwiching the thin integrated circuit between the two layers of the substrate.

12. Method according to claim 1, wherein the step of arranging includes attaching the integrated circuit between the two layers of the substrate by at least one of glue, a thermal process, or an ultrasonic process.

13. Method according to claim 1, wherein the step of forming a conductive structure includes connecting the conductive structure to the contacting surface by electro-galvanic deposition.

14. Method for manufacturing an electronic device, comprising:
- arranging a thin integrated circuit between two layers of a substrate so that the two layers are substantially parallel, said thin integrated circuit having at least one contacting surface;
- forming a hole in at least one layer above said at least one contacting surface;
- forming a conductive structure as an antenna on a surface of said at least one layer facing away from the thin integrated circuit and connecting said conductive structure to said contacting surface by said hole, wherein, said two layers of the substrate each being made from a thermoplastic material; and
- subsequent to arranging the thin integrated circuit between the two layers of the substrate, laminating a structure formed by the thin integrated circuit between the two layers of the substrate.

15. Method for manufacturing an electronic device, comprising:
- arranging a thin integrated circuit between two layers of a substrate so that the two layers are substantially parallel, said thin integrated circuit having at least one contacting surface;
- forming a hole in at least one layer above said at least one contacting surface; and
- forming a conductive structure as an antenna on a surface of said at least one layer facing away from the thin integrated circuit and connecting said conductive structure to said contacting surface by said hole, wherein, said two layers of the substrate each being made from a thermoplastic material, wherein the step of arranging includes heat embedding the thin integrated circuit between the two layers of the substrate.

* * * * *